(12) United States Patent
Burns et al.

(10) Patent No.: US 7,253,605 B2
(45) Date of Patent: Aug. 7, 2007

(54) CONFIGURABLE UTILITY METER CONNECTION INTERFACE

(75) Inventors: Gordon Burns, West Lafayette, IN (US); Kevin Hofinger, West Lafayette, IN (US); Ronald C. Tate, Battleground, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 469 days.

(21) Appl. No.: 10/661,821

(22) Filed: Sep. 11, 2003

(65) Prior Publication Data
US 2007/0007944 A1 Jan. 11, 2007

Related U.S. Application Data (60) Provisional application No. 60/409,966, filed on Sep. 11, 2002.

(51) Int. Cl.
*G01R 7/00* (2006.01)
(52) U.S. Cl. ........................ 324/142; 324/538
(58) Field of Classification Search ................ 324/142, 324/538
See application file for complete search history.

(56) References Cited

U.S. PATENT DOCUMENTS

| 6,275,168 | B1 * | 8/2001 | Slater et al. ........... 340/870.02 |
| 6,734,663 | B2 * | 5/2004 | Fye et al. .................... 324/142 |
| 6,836,108 | B1 * | 12/2004 | Balko et al. ................ 324/142 |
| 6,972,555 | B2 * | 12/2005 | Balko et al. ................ 324/142 |

* cited by examiner

*Primary Examiner*—Walter Benson
(74) *Attorney, Agent, or Firm*—Maginot, Moore & Beck

(57) ABSTRACT

A configurable buss element for an electricity meter includes a conductive piece of metal formed into a series of contact connectors and a network of elongate conductors extending between and among the series of contact connectors. Each of the plurality of contact connectors is configured to contact a circuit element of an electricity meter. The network of elongate conductors is operable to provide connectivity between the contact connectors and select portions of the conductive piece of metal in one of a plurality of connectivity configurations, each of the connectivity configurations corresponding to an electricity meter configuration, the select one of the plurality of connectivity configurations defined by a predetermined set of discontinuities introduced in the network of elongate conductors.

19 Claims, 8 Drawing Sheets

2/3-Element
4 – Wire
FORM 16/15S
FIG. 1a

2-Element
3 – Wire
FORM 25S
FIG. 1b

2-Element
3 – Wire
FORM 45S
FIG. 1c

2-Element
3 – Wire
FORM 12S
FIG. 1d

2-Element
4 — Wire
FORM 29S

FIG. 1e

2-Element
4 — Wire
FORM 36S

FIG. 1f

2-Element
3 — Wire
FORM 56S

FIG. 1g

2/3-Element
4 — Wire
FORM 9/8S

CONFIGURABLE UTILITY METER CONNECTION INTERFACE

This application claims the benefit of U.S. Provisional Patent Application Ser. No. 60/409,966, filed Sep. 11, 2002, which is incorporated herein by reference.

FIELD OF THE INVENTION

The present invention relates generally to electricity meters, and more particularly to connection interfaces between a circuit board in the meter and electrical elements that are not typically mounted to a circuit board.

BACKGROUND OF THE INVENTION

Meters are used to measure electricity consumption.

To this end, they include sensor devices that connect to and or interact with the utility power lines (sensor equipment) and electronic circuits for performing various calculations using signals generated by the sensor devices.

Sensor devices typically include blades received by meter socket jaws and provide a mechanically and electrically sound connection for handling large currents and voltages. The blades are often connected within the meter by large current carrying conductors. Sensor devices may also include current measurement devices, which can include a sensing coil of some sort. Voltage and current signals are obtained from these devices and provided to a circuit board that may include a/d converters and processing circuits that perform metering calculations.

One source of cost in the meter is the connection between the sensor devices and the electronic circuitry on the circuit board. Sensor devices are too large to be on circuit board. Typically, sensor devices are mounted to the housing below circuit board and then wire connections are provided to the circuit board. Wires are soldered or connected by terminals.

The manufacturing process of wiring sensor devices to a printed circuit board in a meter has drawbacks, including the labor cost of individually connecting wires, as well as potential quality problems, e.g., difficult to run wires and manipulate them in the small interior.

One alternative is provided by Schlumberger. This meter has preformed mounts for sensors, and leaf spring terminals that extend upward form the sensors to the circuit board. Although this meter alleviates the drawbacks of handwiring, it still has drawbacks.

One problem is that a custom mount must be made for each meter form. In particular, different meters often have different blade and sensor configurations. Specifically, various standardized meter forms have been defined that require different wiring and connections between and among the blade and sensor elements. The different meter forms result from the fact that electrical service is provided in different ways to different customers, and the methods of measuring these different types of services changes.

By way of example, FIGS. 1a, 1b, 1c, 1d, 1e, 1f, 1g and 1h show different sensor wiring configurations for different meter forms. Each of FIGS. 1a-1h shows a representation of a meter base 12 showing the layout of the current blades 14 and a schematic diagram of the connections within the meter base 12, including transformers/coils, potential blades 18 and neutral blades 18a. In addition, many meter forms include switchable potential links 19 as is known in the art.

Figure 1A:
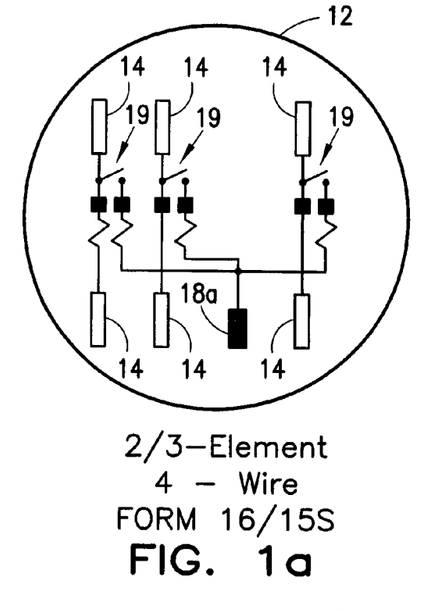
FIGS. 1a-1h show wiring diagrams for various metering forms.
Figure 1B:
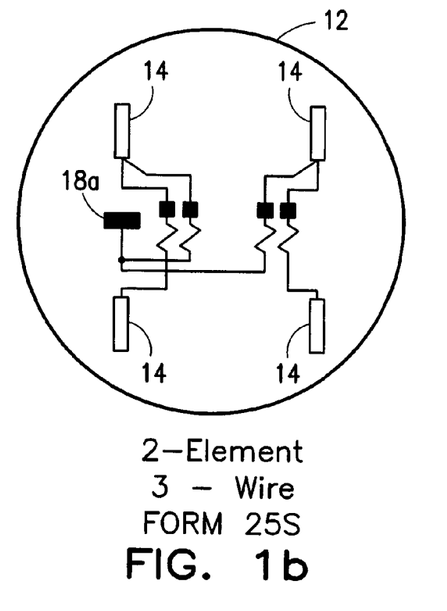
Figure 1C:
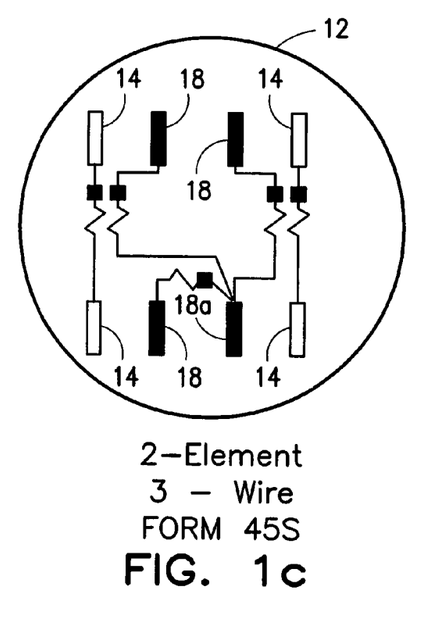
Figure 1D:
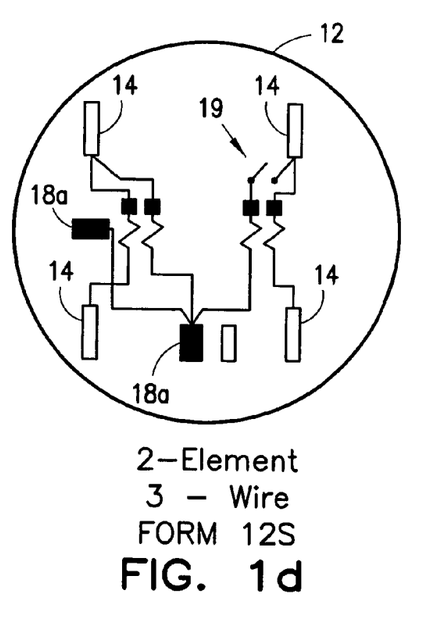
Figure 1E:
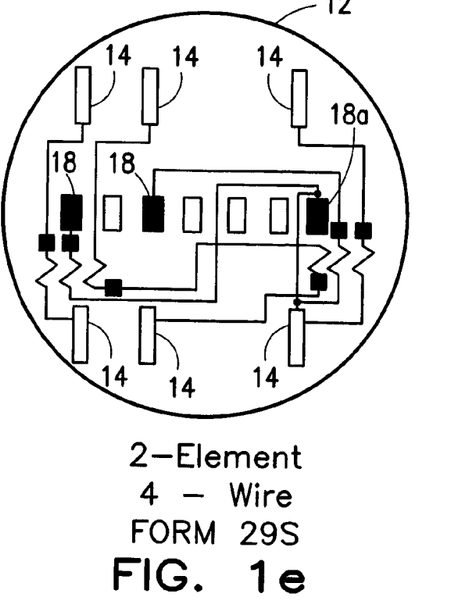
Figure 1F:
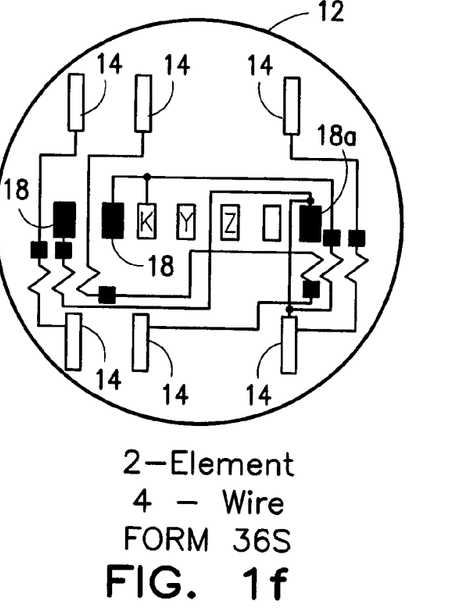
Figure 1G:
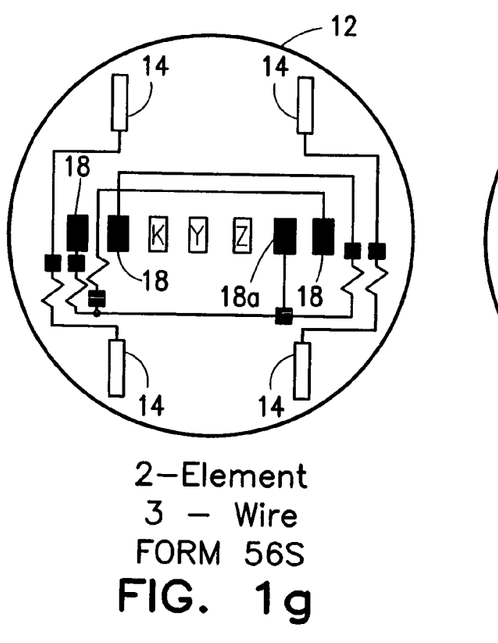
Figure 1H:
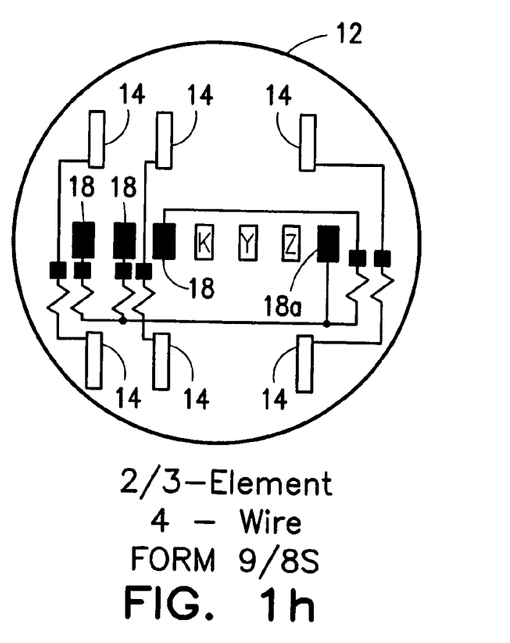

FIG. 1a shows a form 16/15S four wire wire meter configuration, FIG. 1b shows a form 25S three wire meter configuration, FIG. 1c shows a form 45S three wire configuration, and FIG. 1d shows a 12S three wire configuration. The meter forms illustrated in FIGS. 1a-1d are known as "self-contained" meter forms because the meter blades connect directly to the power lines. By contrast FIGS. 1e-1h illustrated transformer-rated meter forms, which couple to the power lines through a transformer. Specifically, FIG. 1e shows a form 29S four wire configuration, FIG. 1f shows a form 36S four wire configuration, FIG. 1g shows a form 56S three wire configuration, and FIG. 1h shows a form 9/8S four wire configuration. Such meter forms and their configurations as represented in FIGS. 1a-1h are well known in the art.

Because different meter forms require different blade and sensor wiring connections, the use of customized base mounts requires that different base mounts be created for each form, which is not always a cost effective solution because of the tooling costs and logistical costs of manufacturing and maintaining several custom designs.

Accordingly, there is a need for a method of reducing the amount of labor involved in wiring sensor devices of electricity meters to the smaller components on the circuit boards of utility meters that does not require custom molds and manufacturing techniques for each different meter form.

SUMMARY OF THE INVENTION

The present invention addresses the above described need, as well as others, by providing a connector buss that includes a conductive form from which a plurality of connector configurations may be readily formed. In particular, the conductive form has a series of contact connectors for receiving meter sensor devices, and a network of conductors in between. By selectively introducing discontinuities in particular ones of the conductors, different meter form connections may be created.

A first embodiment of the invention is a configurable buss element for an electricity meter that includes a conductive piece of metal formed into a series of contact connectors and a network of elongate conductors extending between and among the series of contact connectors. Each of the plurality of contact connectors is configured to contact a circuit element of an electricity meter. The network of elongate conductors is operable to provide connectivity between the contact connectors and select portions of the conductive piece of metal in one of a plurality of connectivity configurations, each of the connectivity configurations corresponding to an electricity meter configuration, the select one of the plurality of connectivity configurations defined by a predetermined set of discontinuities introduced in the network of elongate conductors.

The above described features and advantages, as well as others, will become more readily apparent to those of ordinary skill in the art by reference to following detailed description and accompanying drawings.

DETAILED DESCRIPTION

Figure 2:
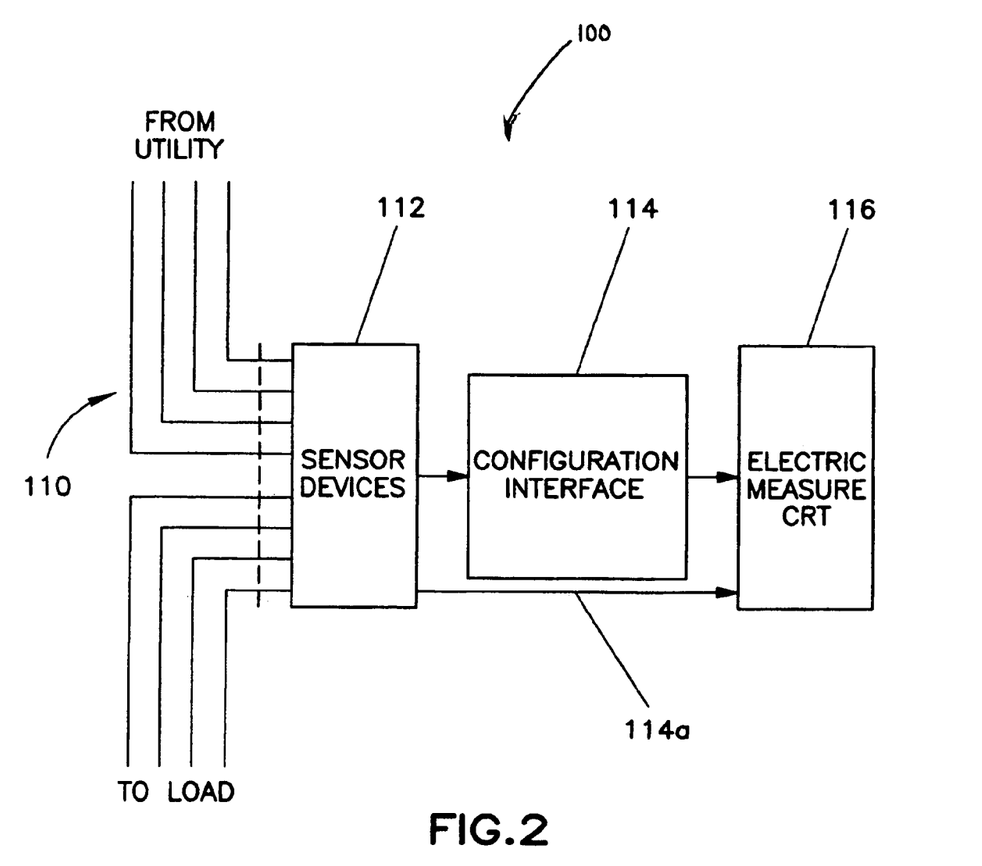
FIG. 2 shows a schematic block diagram of an exemplary meter that incorporates aspects of the invention.

FIG. 2 shows a schematic block diagram of a meter 100 that incorporates aspects of the present invention. The meter 100 is configured to measure energy delivered to a load via power lines 110. The meter 100 includes sensor devices 112, a configurable interface 114, and an electronic measurement circuit 116. The sensor devices 112 connect to power lines 110 and generate signals representative of the voltage and current waveforms on the power lines 110. To this end, the sensor devices 112 include one or more current blades, such as the current blades 14 of FIGS. 1a-1h. The sensor devices 112 may further include voltage and current sensing and/or scaling devices as is well known in the art.

Figure 3:
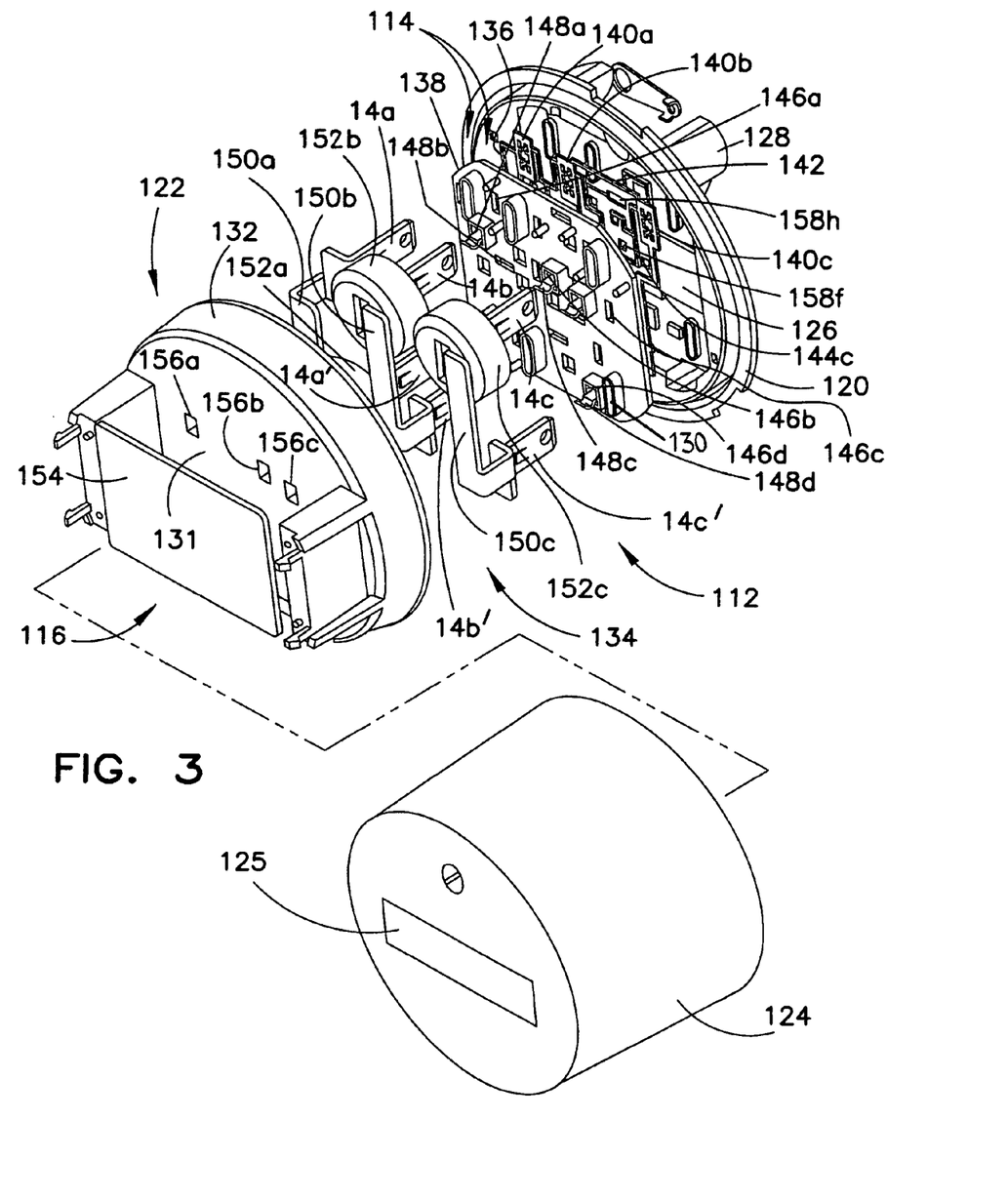
FIG. 3 shows a partially exploded perspective view of an exemplary mechanical structure of the meter of FIG. 2.

The electronic measurement circuit 116 is a circuit disposed on one or more supports, such as one or more circuit boards (see e.g. the circuit board 154 of FIG. 3). The electronic measurement circuit 116 is a circuit configured to determine a measurement of the amount of energy being consumed by the load using the signals representative of the current and voltage waveform received from the sensor devices. To this end, the electronic measurement circuit 116 is connected to receive a voltage measurement signal for one or more phase of the power line received from the sensor devices 112, and is further connected to receive a current measurement signal for one or more phases of the power line received from the sensor devices 112.

The configurable interface 114 provides an electrical connection between one or more of the sensor devices and the electronic measurement circuit 116. The configurable interface 116 has a standard interface to the electronic measurement circuit 116, a standard interface to the sensor devices 112, and provides a configurable set of connections between the standard sensor interface and the standard measurement circuit interface. In the embodiment described herein, the configurable interface 114 primarily provides voltage or potential measurement connections between the sensor devices 112 and the electronic measurement circuit 116. Current measurement connections are provided independent of the configurable interface 114, as illustrated by line 114a of FIG. 2. However, it will be appreciated that current measurement connections may also made through the configurable interface 114 if desired.

An exemplary embodiment of the meter 100 is shown in FIG. 3. In particular, FIG. 3 shows a partial exploded perspective view of an exemplary meter 100 that incorporates aspects of the invention. Like elements of FIGS. 2 and 3 employ like reference numbers.

The meter 100 includes an exemplary housing that includes a base support 120, an intermediate support 122 and a cover support 124. The base support 120 is configured to mate with a standard ANSI meter socket, not shown, and is operably to mechanically couple to the intermediate support 122 and the cover support 124. The base support 120, the ANSI meter socket, the intermediate support 122 and the cover support 124 are aligned in a first direction, referred to herein as the axial direction.

The base support 120 may suitably be a molded structure generally comprising a platform 126 and a set of supports 128. The platform 126 generally forms the bottom wall of the meter, and generally extends in one or more planes that are normal to the axial direction. A number of features are molded into the platform 126 that facilitate support of various elements of the meter 100. The nature and extent of these features will necessarily vary from meter to meter and would be readily apparent to those of ordinary skill in the art. Nevertheless, at least some of the features are openings 130 through which the current blades 14a, 14a', 14b, 14b', 14c and 14c' may extend. The supports 128 extend axially downward from the platform 126.

The base support 120 has an outline shape which refers to the general shape the base support in the plane normal to the axial direction. In the exemplary embodiment described herein, the outline shape is generally circular. However, it will be appreciated that the outline shape of the base support 120 may be rectangular or some other shape. In ANSI meters, however, the outline shape will typically be circular.

The intermediate support 122 is an enclosure or cover that fits over the platform 126 of the base support 120. The intermediate support 122 includes a top shelf 131 and a cylindrical sidewall 132 extending axially downward from the top shelf 131. The sidewall 132 and top shelf 131 define a cavity 134 between the platform 126 and the top shelf 131.

The configurable interface 114 is disposed within the cavity 134, and is supported by or on the platform 126. The configurable interface 114 includes a conductive piece of metal 136 attached to a support member 138. In the embodiment described herein, the support member 138 is constructed of molded plastic, preferably polypropylene. The support member 138 is further preferably overmolded onto the conductive piece of metal 136 to partially encapsulate the conductive piece of metal 136.

The conductive piece of metal 136 is formed to define a number of contact connectors (connectors 140a, 140b, and 140c are shown in FIG. 3) and a network of elongate connectors 142. Each of the contact connectors is configured to receive a portion of a sensor blade, such as a current or voltage blade of a utility meter. In the exemplary embodiment of FIG. 3, the connectors 140a, 140b, 140c are located such that they will receive the current blades of most self-contained meter forms, such as those shown in FIGS. 1a-1d. The network elongate connectors 142 is arranged such that selective portions may be punched in any of a plurality of connector configurations that correspond to a particular meter form.

In particular, as discussed above, the conductive piece of metal 136 has uniform contact connectors (e.g. 140a, 140b, 140c) that can receive current blades arranged for use in a number of meter forms. The conductive piece of metal 136 furthermore has uniform circuit board contact outputs (e.g. contact output 144c of FIG. 5) that are electrically connected to the circuit board 154 discussed further below. For each meter form, different connections must be made between the circuit board contact outputs, current blades and even transformer or switch connections. The circuit board contact outputs (see outputs 144a-144d of FIGS. 4 and 5) allow voltage or potential measurements from the sensor blades and/or devices to be provided to the measurement circuit 116 on the circuit board 154.

In the embodiment of FIG. 3, the conductive piece of metal 136 (see also FIG. 5) also includes a number of screw terminals 158a-158h (only 158f and 158h shown in FIG. 3). These screw terminals 158a-158h allow for connection of neutral blades 18a, potential link switches 19, which may or may not be used depending on the meter form.

For example, FIGS. 1a-1d show various meter forms that generally employ similar (and compatible) current blade layouts, but have different connection requirements. For example, in FIG. 1a, the 16S meter generally defines that potential measurements should be taken from the outputs of the potential link switches 19 as well as the neutral blade 18a, while in FIG. 1, the 45S meter form generally defines that potential measurements should be taken from potential blades 18 and the neutral blade 18a. In FIG. 1b, the 25S meter form defines that potential measurements should be taken directly from the current blades 14 and the neutral blade 18a, while in FIG. 1d, the 12S meter form defines that potential measurements should be taken from one current blade 14, one potential link switch 19, and one of three possible neutral blade positions 18a.

The conductive piece of metal 136 is designed such that the network of elongate conductors 142 may be readily configured to provided the connection requirements for each of those meter forms. To configure the conductive piece of metal 136 for a particular meter form, select portions of the metal are cut out or punched out. The select punch out configuration connects predefined receptacles for current blades 14, potential blades 18, neutral blades 18a and potential links 19 with predefined output contacts (e.g. 144a-d of FIG. 4).

Preferably, the conductive piece of metal 136 is a phosphor bronze stamping. It will be appreciated that one or more of the conductors of the network of elongate connectors 142 may be included primarily to ensure that the conductive piece of metal 136 may be formed and manipulated as a single piece. In other words, some of the elongate conductors may never be intended to provide an electrical connection, but function as a bridge section that holds the conductive piece of metal 136 together as a unit. Portions of such elongate conductors are then punched out (along with other conductors not necessary for the meter form) after the support member 138 is secured to (e.g. overmolded onto) the conductive piece of metal 136.

Further detail regarding the specific embodiment of the conductive piece of metal 136 and the support member 138 of FIG. 3 are provided below in connection with FIGS. 4 and 5. An alternative embodiment of a conductive piece of metal and support member suitable for various forms of transformer-rated meters are provided below in connection with FIGS. 6 and 7.

Figure 4:
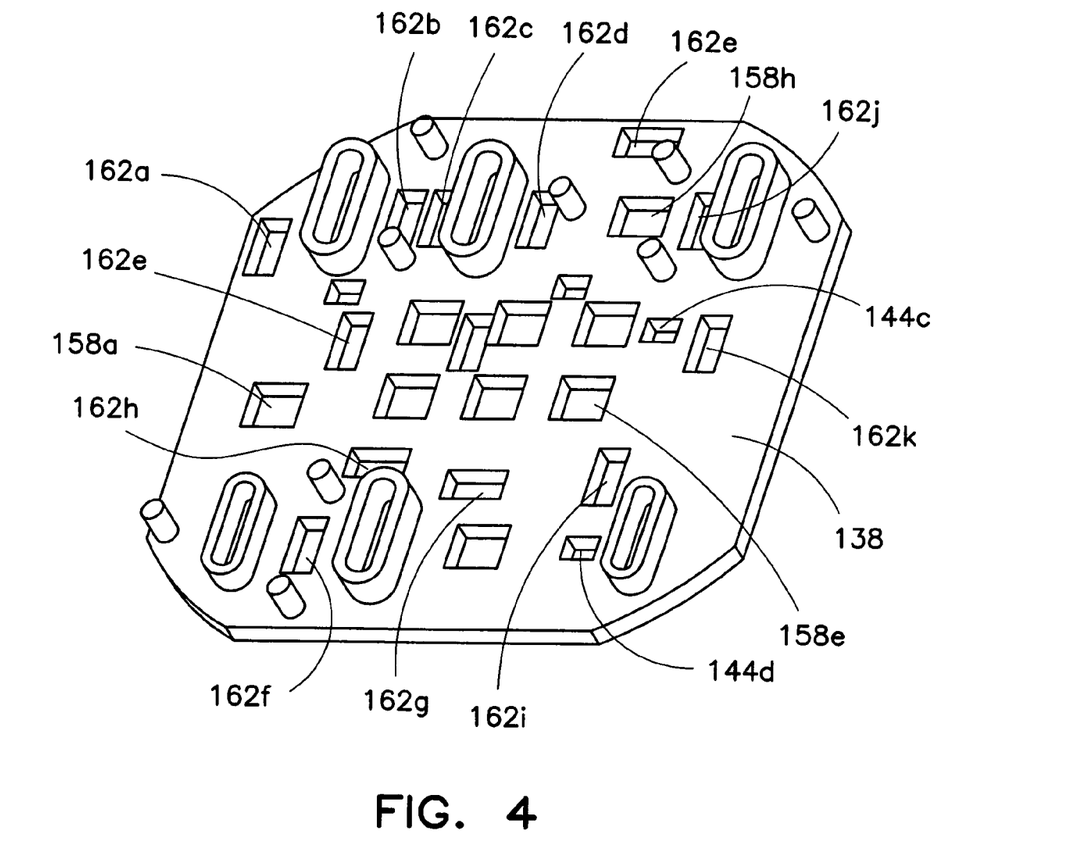
FIG. 4 shows a perspective view of a first exemplary embodiment of a configurable interface in accordance with aspects of the invention.

Referring again to the general assembly of the meter 100 of FIG. 3, the support member 138 includes a number of openings 146a-146d that provide access to the circuit board contact outputs 144a-144d, respectively (outputs 144a, 144b, and 144d shown in FIG. 4 only). Extending generally axially upward from each of the openings 146a-146d is a corresponding leaf spring conductor 148a-148d. Each leaf spring conductor 148a-148d provides an electrical connection between the circuit board contact outputs 144a-144d of the conductive piece of metal 136 to analog inputs of the circuit board 154.

In the embodiment of FIG. 3, the meter 100 includes three pairs of meter blades, 14a and 14a', 14b and 14b', 14c and 14c'. Each pair is connected by a conductive bar referred to as a current coil. Thus, meter blade pair 14a, 14a' is connected by the current coil 150a, meter blade pair 14b, 14b' is connected by the current coil 150b, and the meter blade pair 14c, 14c' is connected by the current coil 150c. In many embodiments, such as the one illustrated in FIG. 3, each meter blade pair and its corresponding current coil is formed as a single metal bar. Current blades, their positioning within the meter, and suitable types of construction are well known in the art.

In the embodiment described herein, three current transformers 152a, 152b, and 152c are in a current sensing relationship with the current coils 150a, 150b and 150c, respectively. Specifically, the current transformer 152a is in the form of a toroid, and includes a center opening through which a portion of the current coil 150a and or current blade 14a passes. The current transformers 152b, 152c are configured in an analogous manner.

In the assembled meter 100, the current coils 150a, 150b and 150c, and the current transformers 152a, 152b and 150c all reside within the cavity 134 between the top plate 131 of the intermediate support 122 and the configurable interface 114. However, the blades 14a, 14a', 14b, 14b', 14c and 14c' all extend axially through the configurable interface 114 and through the platform 126 to the exterior of the meter 100. The blades 14a, 14a', 14b, 14b', 14c and 14c' extend axially downward from the platform 126 so that they may be received by standard meter socket, not shown, but which is well known in the art.

When the meter 100 in installed in a suitable meter socket, the blades 14a, 14a' are positioned to be connected in the path of the phase A power line, the blades 14b, 14b' are positioned to be connected in the path of the phase B power line, and the blades 14c, 14c' are positioned to be connected in the path of the phase C power line. As a consequence, the phase A current flows through, and the phase A voltage is present on, the current blades 14a, 14a' and the current coil 150a. Similarly, the phase B current flows through, and the phase B voltage is present on, the current blades 14b, 14b' and the current coil 150b, and the phase C current flows through, and the phase C voltage is present on, the current blades 14c, 14c' and the current coil 150c.

It is noted that select of the current blades (e.g 14a) pass through and make electrical contact with select contact connectors (e.g. 140a) of the configurable interface 114. In the exemplary embodiment of FIG. 3, the current blades 14a, 14b, and 14c pass through and make contact with, respectively, contact connectors 140a, 140b, and 140c. The current blade 14b' also passes through another contact connector 140d, not shown in FIG. 3 (see FIG. 4). The particular current blade and current transformer configuration of FIG. 3 corresponds to a 16/15S meter form, such as illustrated in FIG. 1a.

Referring again to the intermediate support 122, the top shelf 131 supports a printed circuit board 154 on which at least a portion of the electronic measurement circuit 116 resides. The top shelf 131 includes openings 156a, 156b and 156c through which the leaf spring connectors 148a, 148b, and 148c pass, thereby allowing contact of the leaf spring connectors 148a, 148b, and 148c with select predetermined input locations on the printed circuit board 155. The leaf spring connector 148d passes through a similar opening in the top shelf 131, not visible in FIG. 3. Additional openings, not shown, may be provided to allow the leads from the current transformers 152a, 152b and 152c to pass to the circuit board 154.

As discussed above, the embodiment of the meter 100 shown in FIG. 3 is shown as a 16S meter form, which corresponds to the FIG. 1a standard wiring diagram. In a 16S meter form, voltage measurements are taken from each phase voltage with respect to a neutral. Specific to the meter form (see FIG. 1a), the voltage measurements are typically taken at the output of the potential link as is known in the art. To this end, in the meter 100 of FIG. 3, the contact connectors 140a, 140b, and 140c obtain the phase A, B and C voltages, respectively. The conductive piece of metal 136, which will have been previously punched out in a predetermined pattern defined for a 16S meter form, will provide the phase A voltage to the leaf spring connector 148a through the output contact 144a (see FIG. 4). The conductive piece of metal 136 will similarly provide the phase B voltage to the leaf spring connector 148b through the output contact 144b (see FIG. 4), and provide the phase C voltage to the leaf spring connector 148c through the output contact 144c. In a 16S meter form, each of the above connections further occurs through a potential link, not shown, connected to two of the screw terminals 158b-158g.

As is known in the art, the meter 100 includes a neutral potential blade (see representative blade 18a of FIG. 1a). Although not shown in FIG. 3, such a blade would typically be secured to the platform 126 in an industry standard location, and extends axially downward through the platform 126 to the exterior of the meter 100. The neutral blade is connected to one of the screw terminals 158a-158h, and specifically screw terminal 158g in the 16S meter form. Alternatively, a wire lead (or other type of connector) would be provided to a predetermined position on the conductive piece of metal 136. In any event, the neutral blade is electrically connected to the leaf spring connector 148d.

Thus, because of the configuration of the conductive piece of metal 136, the leaf spring connectors 148a, 148b, 148c and 148d provide to the measurement circuit 116 on the circuit board 154 the phase A, B, and C potentials. The measurement circuit 116 then uses this information along with phase A, B and C current information provided by the current transformers 152a, 152b and 152c to perform various energy-related calculations.

The cover support 124 is a generally cylindrical body that covers over the intermediate support 122 and the interior 134. In an exemplary embodiment, the cover support 124 supports an LCD display 125. However, it will be appreciated that a display may alternatively be supported on the intermediate support 124, or by still another support member, not shown.

Figure 5:
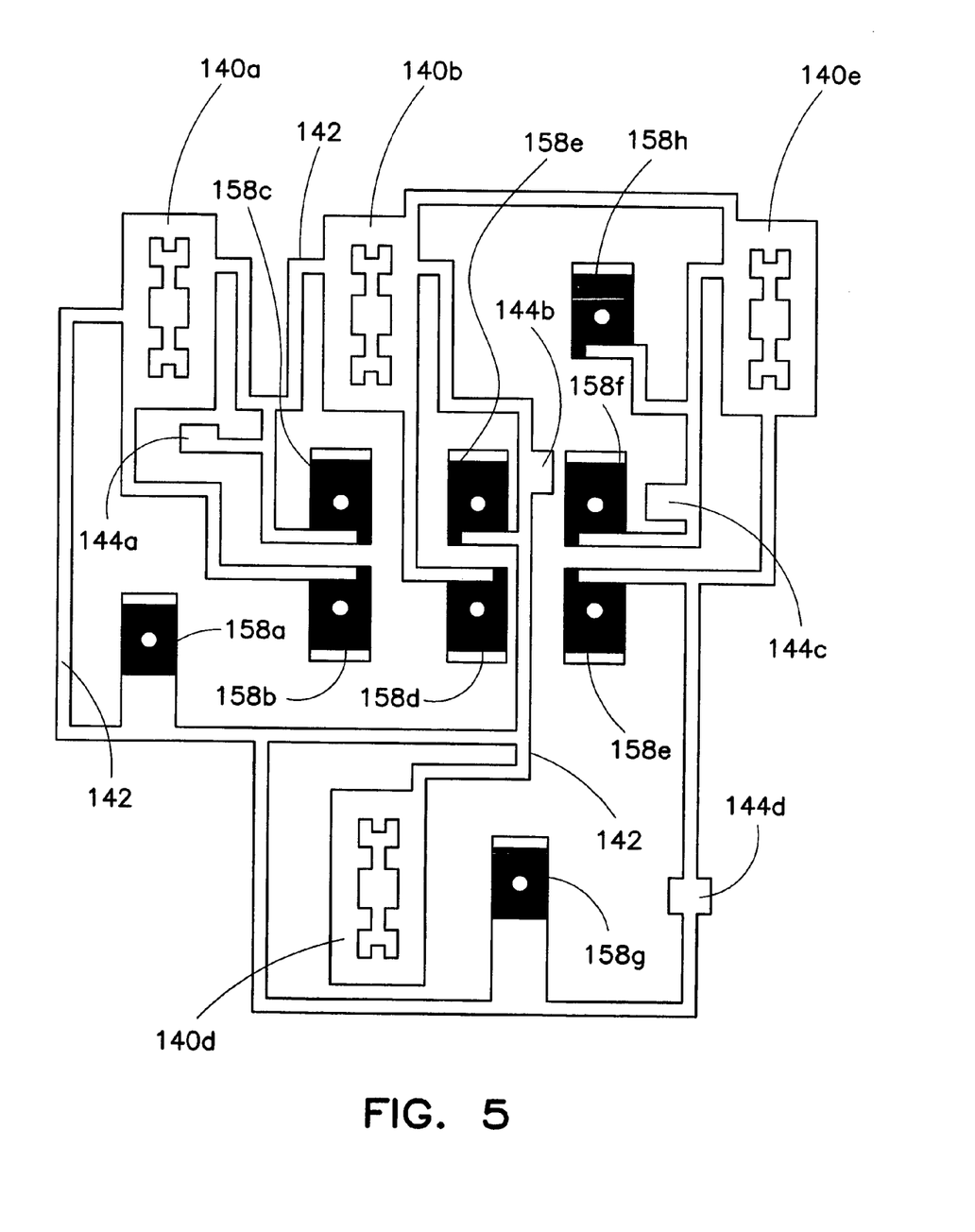
FIG. 5 shows a top plan view of a conductive piece of metal that may be used in configurable interface of FIG. 4.

FIGS. 4 and 5 show in greater detail the configurable interface 114 of FIG. 3. In general, the configurable interface 114 is suitable for self-contained meter forms, and specifically, forms 1a, 1b, 1c, and 1d. The conductive piece of metal 136 includes a set of contact connectors 140a, 140b, 140c and 140d, each having a center opening generally configured to receive a standard current or potential blade. Each of contact connectors 140a, 140b, 140c and 140d include inward extensions within the center opening that engage an inserted sensor blade. The inward extensions deform slightly when the blade is inserted, and tend to urge the blade toward the other inward extensions located on the opposite side of the center opening.

The contact connector 140a receives the phase A current blade in each self-contained meter form of FIGS. 1a-1d. The contact connector 140b receives the phase B current blade in the 16S form, and receives a phase A high potential blade in the 45S form. The contact connector 140c receives the phase C meter form in all forms in FIGS. 1a-1d. and the contact connector 140d receives the phase B current coil in the 16S form, and receives the phase A low potential blade in the 45S form.

The output contacts 144a-144d represent slightly width extensions on the network of elongate conductors 142. The output contact 144a provides a phase A voltage output to the circuit board 154 in forms 16S, 25S and 12S. The output contact 144a provides phase A high potential voltage output to the circuit board in form 45S. The output contact 144b provides the phase B voltage output to the circuit board 154 in form 16S, and provides the phase A low potential voltage output to the circuit board 154 in form 45S. The output contact 144c provides a phase C voltage output in all self-contained forms of FIGS. 1a-1d. The output contact 144d provides a neutral connection in all forms of FIGS. 1a-1d.

The screw terminal 158a connects to a neutral blade in forms 25S and 12S. The screw terminals 158b, 158c connect to a potential link in the 16S form, as do the screw terminals 158d, 158e. The screw terminals 158f, 158g connect to a potential link in meter forms 16S and 12S. The screw terminal 158g connects to a neutral blade in forms 16S, 45S and 12S. The screw terminal 158h connects to a phase C potential blade in form 45S.

The network of elongate conductors 142 are configured as shown, or in a similar manner, to connect the various elements described above. Portions of the network of elongate conductors 142 may be selectively cut or removed such that the remaining connections provide the connectivity defined for one of the self-contained meter forms. Those of ordinary skill in the art may readily determine how to cut the elongate conductors 142. FIG. 4 shows a number of cut-out blanks 162 formed in the support 138. The location of these cut-out blanks 162 provides an indication of possible locations at which the network of conductors 142 may be cut. The cut-out blanks 162 are preferably of lesser thickness than other portions of the support 138 in order to facilitate punching out of those portions.

Referring again to the network of conductors 142, the cut-outs or punch outs should be of sufficient length to prevent phase to phase arcing across the space formed by the cut-out. By way of example, the cut-outs should be at least four tenths of an inch long. The cut-out blanks 162 should have at least this length to facilitate a proper length punch out. It is noted that adjacent (i.e. parallel) conductors of the network 142 may be closer than four tenths if the support 138 is molded around the conductive piece of metal 136. In such a case (or if the support 138 is potted around the metal 136), the support acts as a guard against phase to phase arcing.

By way of example, to form a 16S meter, punches should be made through the network of conductors 142 (and the cutout blanks 162) at the cutout blanks 162a, 162b, 162c, 162d, 162l, 162j, 162k, 162g and 162h, at a minimum.

Figure 6:
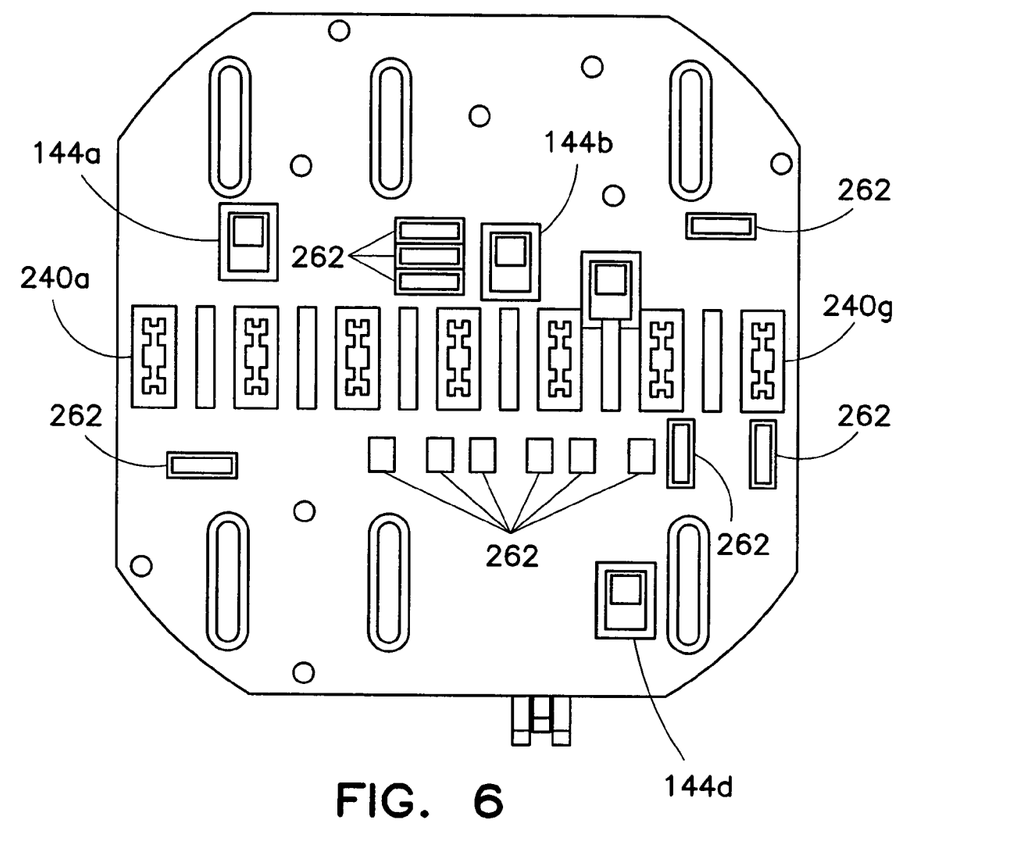
FIG. 6 shows a perspective view of a second exemplary embodiment of a configurable interface in accordance with aspects of the invention.
Figure 7:
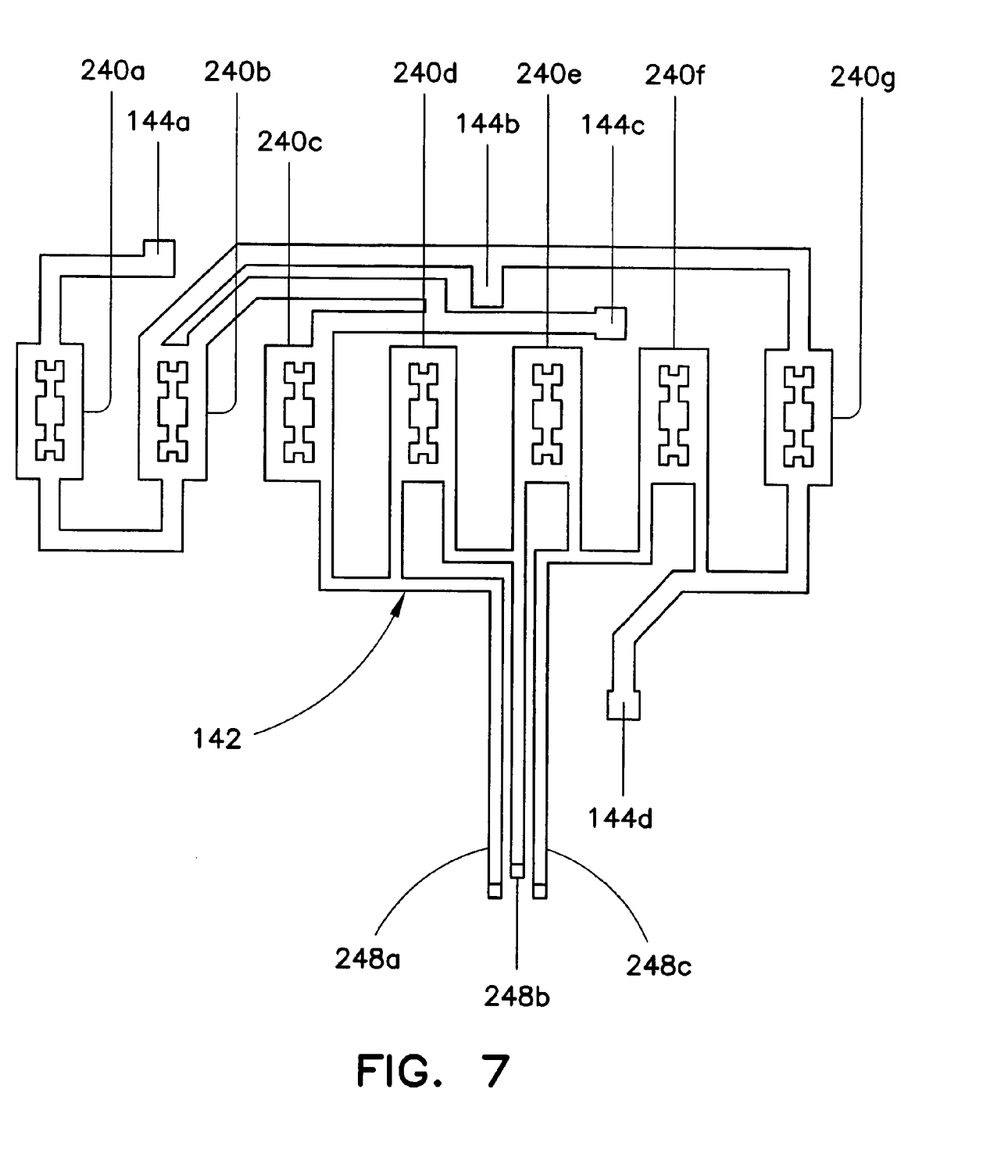
FIG. 7 shows a top plan view of a conductive piece of metal that may be used in configurable interface of FIG. 6.

Using the above described configuration as an example, the concept may be applied to the transformer-rated forms of FIGS. 1e-1h using the configurable interface of FIGS. 6 and 7. In FIG. 7, the contact connectors 240a-240g receive potential blades and optionally KYZ blades, as illustrated in FIGS. 1e-1h. Cutouts 262may be used to ensure that the proper KYZ blades are connected to KYZ outputs 248a-c, and that the potential blades are connected to the corresponding outputs 144a-144d.

Because self-contained meters generally only obtain voltage measurements from potential blades (and not a combination of current blades, potential blades, and potential links), the implementation of the cutouts in FIG. 1e-1f is more readily discerned from inspection of FIGS. 1e-1f, 6 and 7. Accordingly, further description is not necessary.

It will be appreciated that the exact configuration of the network of connectors 142 in either embodiment may take a nearly infinite number of forms and accomplish the same result. Accordingly, broad aspects of the invention do not contemplate the exact layout of the network of conductors 142, so long as they may be configured to connect the other elements of the conductive piece of metal and may be cut out in patterns to establish connection configurations between sensor blades and output contacts to a circuit board.

We claim:

1. A configurable buss element for an electricity meter, the buss element comprising a conductive piece of metal formed into a series of contact connectors and a network of elongate conductors extending between and among the series of contact connectors, each of the plurality of contact connectors configured to contact a circuit element of an electricity meter, the network of elongate conductors operable to provide connectivity between the contact connectors and select portions of the conductive piece of metal in one of a plurality of connectivity configurations, each of the connectivity configurations corresponding to an electricity meter configuration, the select one of the plurality of connectivity configurations defined by a predetermined set of discontinuities introduced in the network of elongate conductors.

2. The configurable buss element of claim 1 further comprising a plastic housing affixed to the conductive piece of metal.

3. The configurable buss element of claim 2 wherein the plastic housing includes a first set of openings corresponding to the contact connectors.

4. The configurable buss element of claim 3, wherein the plastic includes a set of indicia, the set of indicia disposed above select portions of the network of elongate connectors, the select portions of the network of elongate connectors constituting locations at which discontinuities may be introduced to form any of the plurality of connectivity configurations.

5. The configurable buss element of claim 1 further comprising a plastic housing overmolded onto the conductive piece of metal.

6. The configurable buss element of claim 1 wherein the conductive piece of metal comprises a phosphor bronze stamping.

7. The configurable buss element of claim 1 wherein at least one of the contact connectors is configured to receive a meter blade, the meter blade having an end configured to be received by a standard electricity meter socket.

8. The configurable buss element of claim 1 wherein the conductive piece of metal is further formed into connector contact pads formed in the network of elongate conductors.

9. A method of forming a connection between at least one sensor device of an electricity meter and at least one electrical component disposed on a circuit board, the method comprising:
  a) providing a conductive piece of metal formed into a series of contact connectors and a network of elongate conductors extending between and among the series of contact connectors,
  b) introducing one of a plurality of sets of discontinuities in the network elongate conductors, each of the plurality of sets of discontinuities in the network elongate conductors corresponding to one of a plurality of meter configurations;
  c) disposing at least part of a sensor device within one of a plurality of contact connectors formed in a conductive piece of metal.

10. The method of claim 9 wherein step a) further comprises providing a plastic housing affixed to the conductive piece of metal.

11. The method of claim 10 wherein step a) further comprises providing the plastic housing such that the plastic housing includes a first set of openings corresponding to the contact connectors.

12. The method of claim 11 wherein step a) further comprises providing a set of indicia in the plastic housing, the set of indicia disposed above select portions of the network of elongate connectors, the select portions of the network of elongate connectors constituting locations at which discontinuities may be introduced to form any of the plurality of connectivity configurations.

13. The method of claim 9 wherein step a) further comprises providing a plastic housing overmolded onto the conductive piece of metal.

14. The method of claim 9 wherein step a) further comprises providing a phosphor bronze stamping as the conductive piece of metal.

15. A configurable buss element for an electricity meter, the buss element comprising:
  a unitary piece of metal formed into a series of Contact connectors and a network of elongate conductors extending between and among the series of contact connectors, each of the plurality of contact connectors configured to contact a circuit element of the electricity meter, the network of elongate conductors operable to provide connectivity between the contact connectors and select portions of the unitary piece of metal in one of a plurality of connectivity configurations, each of the connectivity configurations corresponding to an electricity meter configuration;
  a support member attached to the unitary piece of metal, the support member including a first plurality of openings providing access to predetermined portions of the network of elongate conductors, wherein connections between the elongate conductors are manipulated through the plurality of openings to form one of the plurality of connectivity configurations by providing discontinuities in the network of elongate conductors.

16. The configurable buss element of claim 15, wherein the support member includes a second plurality of openings corresponding to the contact connectors.

17. The configurable buss element of claim 16, wherein the support member includes a set of indicia, the set of indicia disposed above select portions of the network of elongate connectors, the select portions of the network of elongate connectors constituting locations at which discontinuities may be introduced to form any of the plurality of connectivity configurations.

18. The configurable buss element of claim 15 wherein the unitary piece of metal comprises a phosphor bronze stamping.

19. The configurable buss element of claim 15 wherein at least one of the contact connectors is configured to receive a meter blade, the meter blade having an end configured to be received by a standard electricity meter socket.

* * * * *